(12) United States Patent
Chien et al.

(10) Patent No.: US 6,214,184 B1
(45) Date of Patent: *Apr. 10, 2001

(54) INSULATED WAFER PEDESTAL

(75) Inventors: Tingray Chien, Taipei; Shih-Ming Wang, Shin-Chu; Shun-Hsiang Chen, Hsin Chu, all of (TW)

(73) Assignee: Taiwan Semiconductor Manufacturing Company, Ltd, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/856,126

(22) Filed: May 14, 1997

(51) Int. Cl.$^7$ ............................. C23C 14/34; C23C 16/00
(52) U.S. Cl. ....................... 204/298.15; 118/728; 156/345
(58) Field of Search .................... 204/298.14, 298.15, 204/298.35; 156/345; 118/715, 721, 720, 723 E, 725, 728, 500

(56) References Cited

U.S. PATENT DOCUMENTS

| | | | |
|---|---|---|---|
| 3,141,989 | * 7/1964 | Jones et al. | 204/298.15 |
| 3,977,955 | * 8/1976 | Nevis et al. | 204/298.15 |
| 4,624,728 | * 11/1986 | Bithell et al. | 204/298.35 |
| 4,793,975 | * 12/1988 | Drage | 204/298.15 |
| 5,456,756 | * 10/1995 | Ramaswami et al. | 204/298.15 |
| 5,494,523 | * 2/1996 | Steger et al. | 204/298.15 |
| 5,549,802 | * 8/1996 | Guo | 204/298.15 |
| 5,700,725 | * 12/1997 | Hower et al. | 204/298.15 |
| 5,744,016 | * 4/1998 | Yamada et al. | 204/298.15 |
| 5,800,623 | * 9/1998 | Dyer | 156/345 |
| 5,820,685 | * 10/1998 | Kurihara et al. | 156/345 |

* cited by examiner

Primary Examiner—Nam Nguyen
Assistant Examiner—Gregg Cantelmo
(74) Attorney, Agent, or Firm—Tung & Associates

(57) ABSTRACT

The present invention provides a wafer pedestal for holding a semiconductor wafer that includes a pedestal body of essentially a metal disc and at least three insulating spacers that are situated on a top surface of the pedestal body for supporting and insulating a silicon wafer on and from the pedestal body. A wafer may be suitably supported by the insulating plugs such that no concentrated electric field will form on the wafer surface at or near the insulating plugs to cause arcing and furthermore, the wafer is supported sufficiently away from the pedestal body such that any subsequent film depositions does not adhere the wafer to the pedestal body.

18 Claims, 1 Drawing Sheet

INSULATED WAFER PEDESTAL

FIELD OF THE INVENTION

The present invention generally relates to a pedestal for holding a substrate and more particularly, relates to an insulated pedestal for holding a substrate that includes a pedestal body and at least three spacers of insulating material situated on a top surface of the pedestal body for supporting and insulating a substrate on and from the pedestal body.

BACKGROUND OF THE INVENTION

Physical vapor deposition (PVD) is a frequently used processing technique in the manufacture of integrated circuit chips that involves the deposition of a metallic layer on the surface of a silicon wafer. The technique is also known as a sputtering process. For instance, in more recently developed advanced semiconductor manufacturing technology, the PVD technique is frequently used to deposit metallic layers of TiN as anti-reflective coating or barrier layers.

In a typical PVD process, an inert gas such as argon is first ionized in an electrical field producing a plasma of charged gas particles wherein the particles are attracted toward a negatively charged source (or target). The energy of these gas particles physically dislodges, or sputters off atoms of the metallic target material. Physical vapor deposition is a versatile technique in that many different materials can be deposited by using an RF or a DC power source.

In a typical PVD process chamber 10, as shown in FIG. 1, major components include a stainless steel chamber 12 that is vacuum tight and is equipped with a cryopump 16 which has the capability of reducing the chamber pressure to $10^{-6}$ Torr or lower, a pressure gauge 18, a sputter source or target 20, a power supply (not shown), a wafer holder 26 and a clamp ring 28. The sputter source 20 and the wafer holder 26 are positioned facing each other. The target is a Ti disc when sputtering of TiN is desired. One of such PVD process chamber is the Endura® 5500 which is commercially supplied by Applied Materials, Inc. of Santa Clara, Calif.

The wafer holder 26 is normally a pedestal of a disc shape. In the top surface 34 of pedestal 26, metal screws 36 are used as wafer support by holding a wafer at the tip 38 of screw 36. This is shown in FIG. 2 and FIG. 2A. FIG. 2 is an enlarged, plane view of the pedestal 26 shown in FIG. 1. The pedestal 26 is generally of a metal disc structure that has a pedestal body 42 mounted to a backing plate (not shown). The screw or pedestal pin 36 are generally of a 8–32 stainless steel screw mounted through a bottom surface 44 of the pedestal body 42. The tip 38 of the screw 36 protrudes the top surface 46 of the pedestal body 42 by a distance of approximately 1 mm. The enlarged, cross-sectional view shown in FIG. 2A indicates a section of a wafer that is supported by tip 38 of the pedestal pin 36. It is seen that the outer periphery of wafer 30 normally extends over the pedestal pin 36 by approximately 1 cm. The pedestal pins 36, normally requires at least two on each pedestal body 42 for the secure supporting of a wafer 30. The pedestal pin 36 allows a gap of approximately 1 mm to be maintained between the wafer 30 and the top surface 46 of the pedestal body 42. Such distance between the wafer and the pedestal top surface is necessary so that a subsequently deposited film, i.e., a TiN layer will not glue the wafer to the pedestal surface. A thin TiN film is normally deposited on top of an aluminum-copper film layer as an anti-reflective coating.

In a typical PVD deposition process, as shown in FIG. 1, plasma cloud 16 is generated by a cascading ionization reaction in which electrons and ion pairs are formed. For instance, when an electron bumps into an argon atom, it forms an argon ion and another electron. The newly formed electron then collides with another argon atom such that a chain reaction or ionization reaction is started.

When electrons bombard the wafer surface 48, it can be charged to a negative voltage higher than 30 volts. The charge distribution or the formation of an electric field is more severe at or near the location of wafer pins 36. When the wafer pin 36 has a sharp tip 38 (or a rough tip surface), arcing can occur at one of the three wafer pin locations. During the occurrence of arcing, a large number of hot electrons are showered on top of the wafer surface which greatly heat up the area on the wafer that the electrons showered on and furthermore, causes damage to the same area on the metal film that has been deposited on top of the wafer. For instance, in the present case, the aluminum-copper film predeposited on the wafer surface can be greatly damaged to produce a roughened surface. The arcing damages the metal film severely to alter the appearance and the electrical properties of the metal film during the IC fabrication.

It is therefore an object of the present invention to provide a wafer holder that does not have the drawbacks or shortcomings of a conventional wafer holder device.

It is another object of the present invention to provide an insulated wafer pedestal that does not require electrically-conductive pedestal pins for supporting a wafer on the pedestal.

It is a further object of the present invention to provide an insulated wafer pedestal that is an electrically-non-conductive wafer support such that arcing on the wafer can be eliminated.

It is still another object of the present invention to provide a wafer pedestal that utilizes at least three spacers made of insulating material for supporting and insulating a wafer on and from a pedestal body.

It is yet another object of the present invention to provide an insulated wafer pedestal that has a pedestal body of essentially a metal disc and at least three spacers made of insulating material for supporting and insulating a wafer on and from the pedestal body.

It is another further object of the present invention to provide a wafer pedestal that has a pedestal body equipped with recessed areas such that at least three spacers of insulating material can be mounted in such recessed areas to provide support and insulation for a wafer positioned on the pedestal body.

It is still another further object of the present invention to provide an insulated wafer pedestal that has a pedestal body equipped with apertures therethrough and at least three spacers of insulating material mounted in said apertures for supporting and insulating a wafer on and from the pedestal body.

It is yet another further object of the present invention to provide a metal deposition chamber that has a wafer pedestal equipped with at least three spacers of insulating material mounted in a top surface of a pedestal body for supporting and insulating a wafer on and from the pedestal body.

SUMMARY OF THE INVENTION

In accordance with the present invention, a wafer pedestal for supporting a wafer that has a pedestal body and at least three ceramic spacers on top of the pedestal body for supporting a wafer is provided.

In a preferred embodiment, a pedestal for holding a substrate that has a pedestal body of essentially a metal disc, and at least three spacers of insulating material situated on a top surface of the pedestal body for supporting and insulating a substrate on and from the pedestal body is provided.

In another preferred embodiment, a wafer holder is provided which has a body portion made of an electrically conductive metal, and at least three spacers made of an electrically non-conductive material mounted to the body portion, each of the three spacers has a bottom portion adapted for intimately contacting the body portion, a top portion adapted for supporting a wafer, and a thickness sufficient to keep the wafer at a distance away from the body portion so as not to adhered the wafer to the body portion by a subsequently deposited film.

In yet another preferred embodiment, a metal deposition chamber is provided which includes a DC power supply for producing a plasma, a metal target for producing metal atoms, and a wafer pedestal that has a metallic pedestal body and at least three spacers of insulating material mounted in a top surface of the pedestal body for supporting and insulating a wafer on and from the pedestal body.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer pedestal for use in a physical vapor deposition chamber for holding a substrate that is equipped with a pedestal body made of a conductive metal and at least three spacers made of insulating material for supporting and insulating a substrate on and from the pedestal body.

The present invention novel wafer pedestal for supporting a wafer eliminates potential arcing problem that normally occurs on a conventional wafer pedestal. The present invention wafer pedestal achieves its principal benefit by utilizing, instead of metal pedestal pins, insulating plugs for supporting wafer such that the wafer body is insulated from the metallic wafer pedestal. The insulation prevents the build-up of electric field at the pedestal pin locations such that the potential of arcing is eliminated. The insulating plug of the present invention can be conveniently manufactured. For instance, it can be made of quartz, of one of many machinable ceramics or of a high temperature resistant plastic material. A temperature endurance up to 300° C. is desirable for such application. By utilizing the insulating plug, no concentrated electric field will form on the wafer surface, and the prevention for arcing and roughness formation in the metal layer previously deposited are obtained. One of such previously deposited metal layer may be aluminum-copper.

Figure 1:
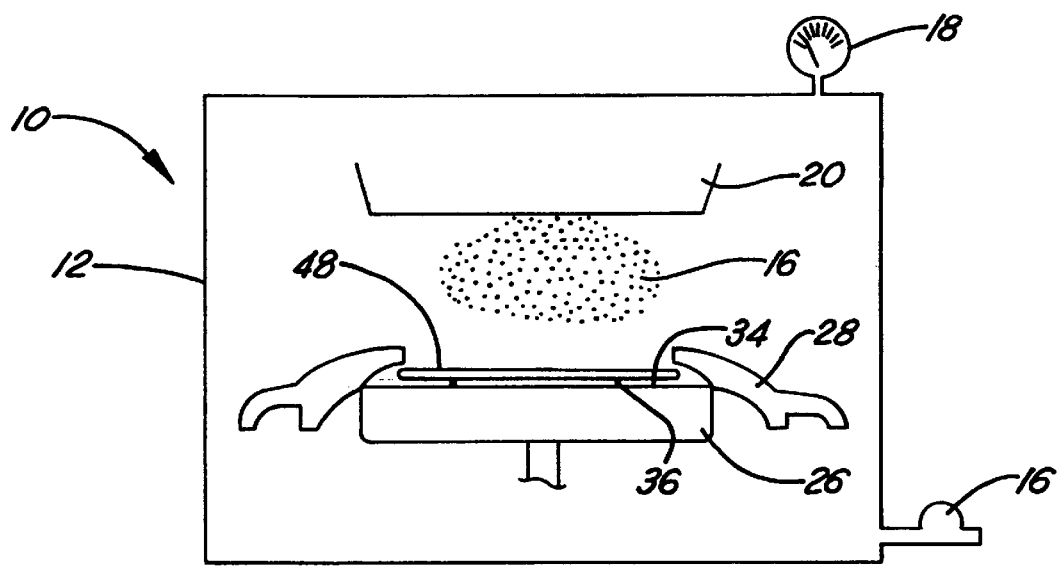
FIG. 1 is an illustration of a cross-sectional view of a typical physical vapor deposition chamber.
Figure 2:
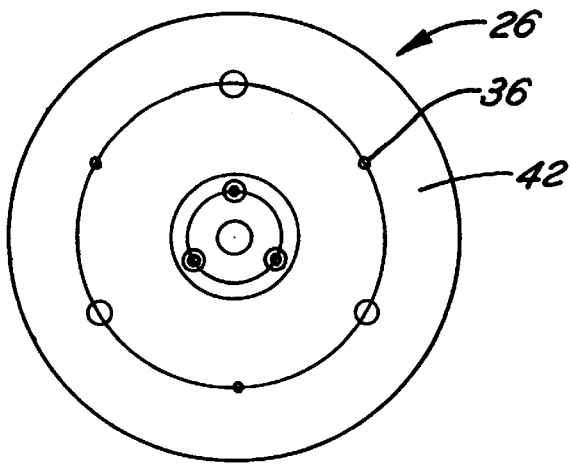
FIG. 2 is an enlarged plane view of the wafer pedestal shown in FIG. 1.
Figure 2A:
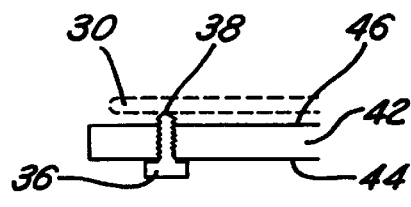
FIG. 2A is an enlarged, cross-sectional view of a partial wafer pedestal and a pedestal pin installed therein.
Figure 3A:
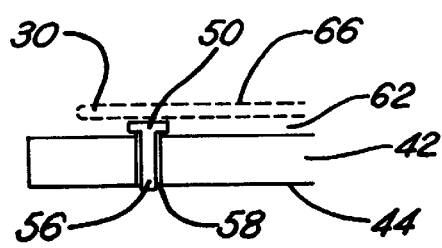
FIG. 3A is an enlarged, cross-sectional view of the present invention ceramic spacer installed in a wafer pedestal.
Figure 3:
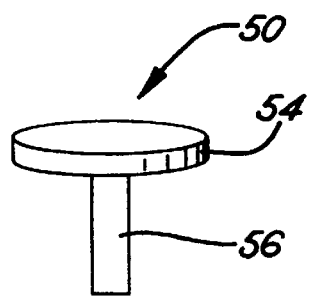
FIG. 3 is an enlarged, perspective view of the present invention ceramic spacer for replacing the metal pedestal pin.

In a preferred embodiment, the insulating plugs are formed in the shape of a bolt, as shown in FIG. 3. The insulating plug 50 has a head portion 54 and a shank portion 56. To accommodate the shank portion 56, the pedestal body 42, as shown in FIG. 3A, is provided with an aperture 58. Aperture 58 has an internal diameter that is slightly larger than the diameter of the shank portion 56 such that a frictional fit may be obtained between the shank 56 and the aperture 58. It should be noted that while an aperture 58 is shown in FIG. 3A, the aperture 58 can be suitably replaced by a recessed hole (not shown) through partial thickness of the pedestal body 42. The recessed hole is more suitable when the pedestal body has a larger thickness or when the shank of the insulating plug has a shorter length. The internal diameter of the recess hole should also be slightly larger than the diameter of the shank portion such that a fictional engagement can be obtained during installation or disassembly of the insulating plug from the pedestal body. The insulating plugs may also be called insulating spacers since they provide a gap between the wafer supported and the top surface of the pedestal body.

As shown in FIG. 3A, the ghost line indicates a wafer body 30 that is being supported by the insulating plug 50 at a suitable gap 62 away from the top surface 46 of the pedestal body 42. A suitable gap 62 is between about 0.5 mm to about 2.5 mm, and more preferably between about 0.8 mm and about 1.5 mm. The gap 62 is determined by the thickness of the head portion 54 of the plug 50. By suitably adjusting the thickness of the head portion 54, the gap 62 can be adjusted accordingly. The gap 62 is desirable from an insulation point of view such that a strong electric field is not formed on the wafer 30 at or near the insulating plug 50 to avoid the potential of arcing. When arcing occurs, the metal film that was previously deposited on the wafer surface 66 is bombarded by electrons to cause film roughness and various other film defects. The gap 62 further serves the function of keeping the wafer 30 sufficiently away at a distance from the top surface 46 of the pedestal body 42 in a subsequent film process. For instance, when a TiN film is subsequently deposited on an aluminum-copper film as an anti-reflective coating layer, the gap 62 prevents the TiN film from bridging the wafer 30 and the pedestal body 42 and thus avoids the wafer being adhered to the pedestal body. When a TiN film is bridged over the wafer and the pedestal body, great difficulty result and potential particle sources when the wafer is to be removed from the pedestal body after the deposition process. It is therefore another advantageous result achieved by the present invention insulating plug for keeping the wafer sufficiently away from the pedestal body during a film deposition process.

It should be noted that while in the preferred embodiment, at least three insulating plug or spacers are illustrated for supporting a wafer. Obviously, the use of even larger number of plugs is also possible. When only three plugs are used, the plugs must have a wide surface area in order to support a wafer securely.

The present invention is also directed to a metal deposition chamber for use in a physical vapor deposition process that includes a DC power supply for producing a plasma gas, a metal target for producing metal atoms, and a wafer pedestal that has a metal pedestal body and at least three insulating plugs mounted in the top surface of the pedestal body for supporting a wafer on and insulating a wafer from the pedestal body. A suitable distance between the wafer and the pedestal body is between about 0.5 mm to about 2.5 mm, and more preferably between about 0.8 mm and 1.5 mm.

While the present invention has been described in an illustrative manner, it should be understood that the terminology used is intended to be in a nature of words of description rather than of limitation.

Furthermore, while the present invention has been described in terms of several preferred embodiments, it is to be appreciated that those skilled in the art will readily apply these teachings to other possible variations of the inventions.

The embodiment of the invention in which an exclusive property or privilege is claimed are defined as follows:

1. A wafer pedestal for holding a wafer comprising:

a pedestal body in the shape of a disc, and at least three spacers of insulating material situated stationarily on a top surface of said pedestal wherein said at least three spacers are of a bolt shape having a head portion and a shank portion body for supporting and insulating a wafer on and from said pedestal body such that said wafer is electrically insulated from said wafer pedestal.

2. A pedestal according to claim 1, wherein said substrate is a silicon wafer.

3. A pedestal according to claim 1, wherein said pedestal body further comprises at lest three recessed area for receiving said shank portions of said at least three spacers.

4. A pedestal according to claim 1, wherein said pedestal body further comprises at least three apertures for frictional engagement with the shank portions of said at least three spacers.

5. A pedestal according to claim 1, wherein the head portion of said at least three spacers are for supporting a substrate.

6. A pedestal according to claim 1, wherein said at least three spacers are made of a ceramic material for surviving a 300° C. service temperature.

7. A pedestal according to claim 1, wherein said head portion having a thickness to keep the substrate at a distance away from said pedestal body such that the substrate is not adhered to the pedestal body by a subsequently deposited film.

8. A pedestal according to claim 1, wherein said substrate is insulated from said pedestal body such that arcing is eliminated.

9. A wafer holder comprising:

a body portion made of an electrically conductive metal, and at least three spacers made of an electrically non-conductive material stationarily mounted to said body portion, each of said at least three spacers having a bottom portion for intimately contacting said body portion, a top portion for supporting a wafer, and a thickness to keep said wafer at a distance away from said body portion so as not to adhere the wafer to the body portion by a subsequently deposited film wherein said at least three spacers are of a bolt shape with said top portion being a bolt head and said bottom portion being a bolt shank.

10. A wafer holder according to claim 9, wherein said body portion is a metal disc.

11. A wafer holder according to claim 9 further comprising recessed areas in a top surface of said body portion for receiving said at least three spacers.

12. A wafer holder according to claim 9 further comprising at least three apertures in said body portion adapted for receiving the bottom portion of said at least three spacers.

13. A wafer holder according to claim 9, wherein said at least three spacers are made of a ceramic material.

14. A wafer holder according to claim 9, wherein said distance between said wafer and said body portion of the holder kept by the at least three spacers is between 0.5 mm and 2.5 mm.

15. A wafer pedestal for holding a wafer comprising:

a pedestal body in the shape of a disc, and at least three spacers of insulating material situated stationarily on a top surface of said pedestal body for supporting and insulating a wafer on and from said pedestal body, said at least three spacers are of a bolt shape having a head portion for supporting a wafer and a shank portion for engaging said pedestal body.

16. A pedestal according to claim 15, wherein said pedestal body further comprises at least three apertures for frictional engagement with the shank portions of said at least three spacers.

17. A pedestal according to claim 15, wherein said at least three spacers are made of a ceramic material for surviving a 300° C. service temperature.

18. A pedestal according to claim 15, wherein said head portion having a thickness for keeping the substrate at a distance away from said pedestal body such that the substrate is not adhered to the pedestal body by a subsequently deposited film.

* * * * *